United States Patent
Jeong et al.

(10) Patent No.: US 10,545,689 B2
(45) Date of Patent: Jan. 28, 2020

(54) DATA STORAGE DEVICE AND OPERATING METHOD THEREOF

(71) Applicant: SK hynix Inc., Gyeonggi-do (KR)

(72) Inventors: Jae Hyeong Jeong, Seoul (KR); Kwang Hyun Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 5 days.

(21) Appl. No.: 15/877,823

(22) Filed: Jan. 23, 2018

(65) Prior Publication Data
US 2018/0293007 A1    Oct. 11, 2018

(30) Foreign Application Priority Data
Apr. 5, 2017   (KR) .......... 10-2017-0044169

(51) Int. Cl.
*G06F 12/00* (2006.01)
*G06F 3/06* (2006.01)
*G11C 29/52* (2006.01)
*G06F 11/10* (2006.01)

(52) U.S. Cl.
CPC .......... *G06F 3/0619* (2013.01); *G06F 3/0644* (2013.01); *G06F 3/0679* (2013.01); *G06F 12/00* (2013.01); *G06F 11/1068* (2013.01); *G11C 29/52* (2013.01)

(58) Field of Classification Search
CPC ..................................................... G06F 12/00
USPC .......................................................... 711/103
See application file for complete search history.

(56) References Cited

U.S. PATENT DOCUMENTS

| | | | |
|---|---|---|---|
| 2010/0064095 A1* | 3/2010 | Chen ................... | G06F 12/0855 711/103 |
| 2015/0229337 A1* | 8/2015 | Alhussien ............. | H03M 13/35 714/773 |
| 2017/0102896 A1* | 4/2017 | D'Abreu ............... | G06F 3/0619 |

FOREIGN PATENT DOCUMENTS

KR    1020120113853    10/2012

* cited by examiner

*Primary Examiner* — Gautam Sain
(74) *Attorney, Agent, or Firm* — IP & T Group LLP

(57) ABSTRACT

A method for operating a data storage device includes providing a nonvolatile memory device including a page divided into a first half page and a second half page; dividing, when receiving data smaller than a size of a page, the data into first and second partial data; generating first and second valid data by adding metadata to the first and second partial data; generating first dummy data to be stored in the first half page together with the first valid data and second dummy data to be stored in the second half page together with the second valid data; storing the first valid data in the first half page and the second valid data in the second half page such that the first and second valid data are successive; and storing the first dummy data in an unused area of the first half page and the second dummy data in an unused area of the second half page.

4 Claims, 11 Drawing Sheets

DATA STORAGE DEVICE AND OPERATING METHOD THEREOF

CROSS-REFERENCES TO RELATED APPLICATION

The present application claims priority under 35 U.S.C. § 119(a) to Korean application number 10-2017-0044169, filed on Apr. 5, 2017, which is herein incorporated by reference in its entirety.

BACKGROUND

1. Technical Field

Various embodiments generally relate to a semiconductor apparatus, and more particularly, to a data storage device employing a nonvolatile memory device as a storage medium.

2. Related Art

Recently, the paradigm for the computer environment has been converted into ubiquitous computing so that computer systems can be used anytime and anywhere. As a result, the use of portable electronic devices such as mobile phones, digital cameras, and notebook computers has rapidly increased. In general, such portable electronic devices use a data storage device which employs a memory device. A data storage device is used to store data to be used in a portable electronic device.

A data storage device employing a memory device provides advantages in that, since there is no mechanical driving part, stability and durability are excellent, information access speed is high and power consumption is small. Data storage devices having such advantages include a universal serial bus (USB) memory device, memory cards having various interfaces, a universal flash storage (UFS) device, and a solid state drive (SSD).

SUMMARY

Various embodiments are directed to a data storage device capable of improving data reliability and an operating method thereof.

In an embodiment, a method for operating a data storage device may include: providing a nonvolatile memory device including a page divided into a first half page and a second half page; dividing, when receiving data smaller than a size of the page from a host device, the data into first partial data and second partial data; generating first valid data and second valid data by adding metadata to the first partial data and the second partial data, respectively; generating first dummy data to be stored in the first half page together with the first valid data and second dummy data to be stored in the second half page together with the second valid data; storing the first valid data in the first half page and the second valid data in the second half page such that the first valid data and the second valid data are successive to each other; and storing the first dummy data in an unused area of the first half page and the second dummy data in an unused area of the second half page.

In an embodiment, a data storage device may include: a nonvolatile memory device including a page which is configured by memory cells corresponding to a first column address to an n^th column address, wherein the page is divided into a first half page which is configured by first memory cells corresponding to the first column address to an h^th column address and a second half page which is configured by second memory cells corresponding to an (h+1)^th column address to the n^th column address; and a controller suitable for dividing, when receiving data smaller than a size of the page, the data into first partial data and second partial data, generating first valid data and second valid data by adding metadata to the first partial data and the second partial data, respectively, generating first dummy data to be stored in the first half page together with the first valid data and second dummy data to be stored in the second half page together with the second valid data, and controlling the nonvolatile memory device such that the first dummy data and the first valid data are stored sequentially in the first memory cells, and the second valid data and the second dummy data are stored sequentially in the second memory cells.

According to the embodiments, the data reliability of a data storage device may be improved.

DETAILED DESCRIPTION

Figure 1:
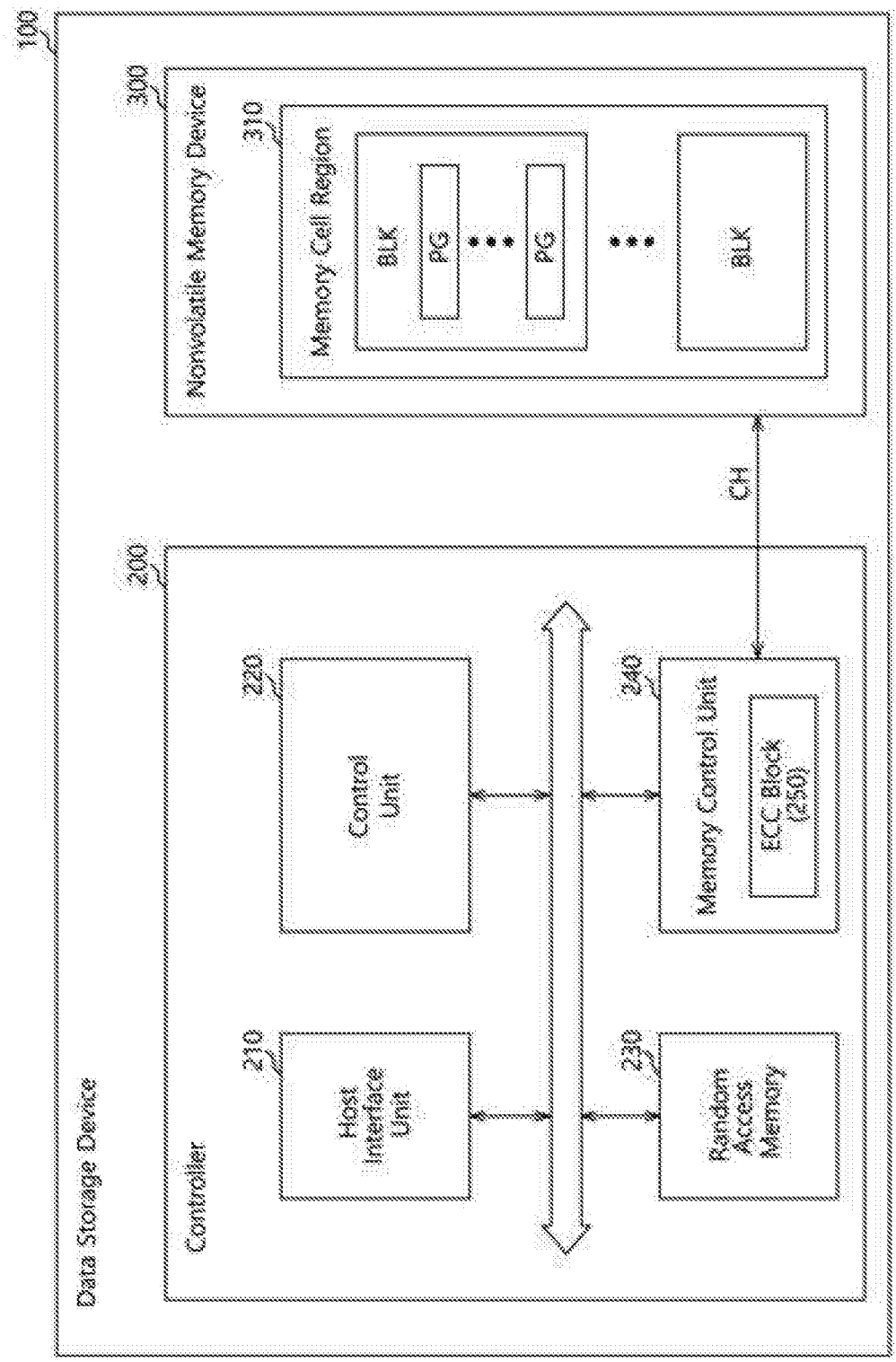
FIG. 1 is a block diagram illustrating a data storage device in accordance with an embodiment of the present invention.

In the present invention, advantages, features and methods for achieving them will become more apparent after a reading of the following exemplary embodiments taken in conjunction with the drawings. The present invention may, however, be embodied in different forms and should not be construed as being limited to the embodiments set forth herein. Rather, these embodiments are provided to describe the present invention in detail to the extent that a person skilled in the art to which the invention pertains can easily enforce the technical concept of the present invention.

It is to be understood herein that embodiments of the present invention are not limited to the particulars shown in the drawings and that the drawings are not necessarily to scale and in some instances proportions may have been exaggerated in order to more clearly depict certain features of the invention. While particular terminology is used herein, it is to be appreciated that the terminology used herein is for the purpose of describing particular embodiments only and is not intended to limit the scope of the present invention.

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes" and/or "including," when used in this specification, specify the presence of at least one stated feature, step, operation, and/or element, but do not preclude the presence or addition of one or more other features, steps, operations, and/or elements thereof.

Hereinafter, a data storage device and an operating method thereof will be described below with reference to the accompanying drawings through various examples of embodiments.

FIG. 1 is a block diagram illustrating a data storage device 100 in accordance with an embodiment of the present invention.

The data storage device 100 may store data to be accessed by a host device (not shown) such as a mobile phone, an MP3 player, a laptop computer, a desktop computer, a game player, a TV, an in-vehicle infotainment system, and so forth. The data storage device 100 may also be referred to as a memory system.

The data storage device 100 may be manufactured as any one of various types of storage devices according to a host interface which is a transmission protocol interfacing the data storage device 100 with the host device. For example, the data storage device 100 may be configured as any one of various types of storage devices such as a solid state drive (SSD), a multimedia card in the form of a MMC, an eMMC, an RS-MMC and a micro-MMC, a secure digital card in the form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, a memory stick, and so forth.

The data storage device 100 may be manufactured as any one among various types of package types. For example, the data storage device 100 may be manufactured as any one of various types of package types such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

The data storage device 100 may include a controller 200 and a nonvolatile memory device 300. The controller 200 may include a host interface unit 210, a control unit 220, a random access memory 230, and a memory control unit 240.

The host interface unit 210 may interface the host device and the data storage device 100. For example, the host interface unit 210 may communicate with the host device by using a host interface which may be any one among standard transmission protocols such as universal serial bus (USB), universal flash storage (UFS), multimedia card (MMC), parallel advanced technology attachment (DATA), serial advanced technology attachment (SATA), small computer system interface (SCSI), serial attached SCSI (SAS), peripheral component interconnection (PCI) and PCI express (PCI-E) protocols.

The control unit 220 may be configured by a micro control unit (MCU) or a central processing unit (CPU). The control unit 220 may process a request which is transmitted from the host device. In order to process the request, the control unit 220 may drive an instruction or an algorithm of a code type, that is, a software, loaded on the random access memory 230, and may control internal function blocks or the nonvolatile memory device 300.

The random access memory 230 may be configured by a random access memory such as a dynamic random access memory (DRAM) or a static random access memory (SRAM). The random access memory 230 may store a software to be driven by the control unit 220. Further, the random access memory 230 may store data necessary for driving the software. That is, the random access memory 230 may operate as the working memory of the control unit 220.

The random access memory 230 may temporarily store data to be transmitted from the host device to the nonvolatile memory device 300 or from the nonvolatile memory device 300 to the host device. In other words, the random access memory 230 may operate as a data buffer memory or a data cache memory.

The memory control unit 240 may control the nonvolatile memory device 300 according to control of the control unit 220. The memory control unit 240 may also be referred to as a memory interface unit. The memory control unit 240 may provide control signals to the nonvolatile memory device 300. The control signals may include a command, an address, a control signal and so forth for controlling the nonvolatile memory device 300. The memory control unit 240 may provide data to the nonvolatile memory device 300 or may receive data read from the nonvolatile memory device 300.

The memory control unit 240 may include an error correction code (ECC) block 250. The ECC block 250 may perform an error detecting operation for detecting whether an error is included in the data read from the nonvolatile memory device 300, and an error correcting operation for correcting the error included in the data. Furthermore, the ECC block 250 may generate and add an error correction code for data to be stored in the nonvolatile memory device 300. The ECC block 250 may detect and correct the error of the data read from the nonvolatile memory device 300, based on the error correction code.

The nonvolatile memory device 300 may be coupled with the controller 200 through a channel CH which includes at least one signal line capable of transmitting a command, an address, control signals and data. The nonvolatile memory device 300 may be used as the storage medium of the data storage device 100.

The nonvolatile memory device 300 may be configured by any one of various types of nonvolatile memory devices such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PCRAM) using a chalcogenide alloy, and a resistive random access memory (RERAM) using a transition metal oxide.

The nonvolatile memory device 300 may include a memory cell region 310. The memory cell region 310 may include a plurality of memory cells. From an operational viewpoint or a physical that is, structural viewpoint, the memory cells included in the memory cell region 310 may be configured into a hierarchical memory cell set or memory cell unit. For example, memory cells to be read and programmed (or written) simultaneously may be configured as a page PG. Also, memory cells to be erased simultaneously may be configured as a memory block BLK. The number of memory blocks which configure the memory cell region 310 and the number of pages which are included in each memory block may be changed variously.

Figure 2:
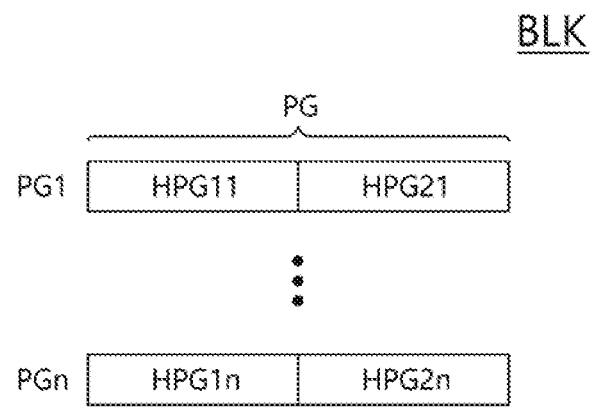
FIG. 2 is a diagram describing pages of a memory block in a nonvolatile memory device in accordance with an embodiment of the present invention.

FIG. 2 is a diagram describing pages of a memory block BLK in a nonvolatile memory device in accordance with an embodiment of the present invention. One memory block BLK included in the memory cell region 310 is illustrated in FIG. 1 as an example.

Referring to FIG. 2, the memory block BLK may include a plurality of pages PG1 to PGn. Each of the pages PG1 to PGn may be divided into a first half page and a second half page. For example, the first page PG1 may be divided into a first half page HPG11 and a second half page HPG21, and the n^th page PGn may be divided into a first half page HPG1$n$ and a second half page HPG2$n$.

A page PG may mean a unit for reading the entire memory cells included in the page PG. A half page HPG may mean a unit for reading only half of the memory cells included in the page PG in order to improve a reading speed. Thus, the half page HPG may correspond to half the size of the page PG. Hereunder, the page PG will be defined as a first read unit, and the half page HPG will be defined as a second read unit.

Figure 3:
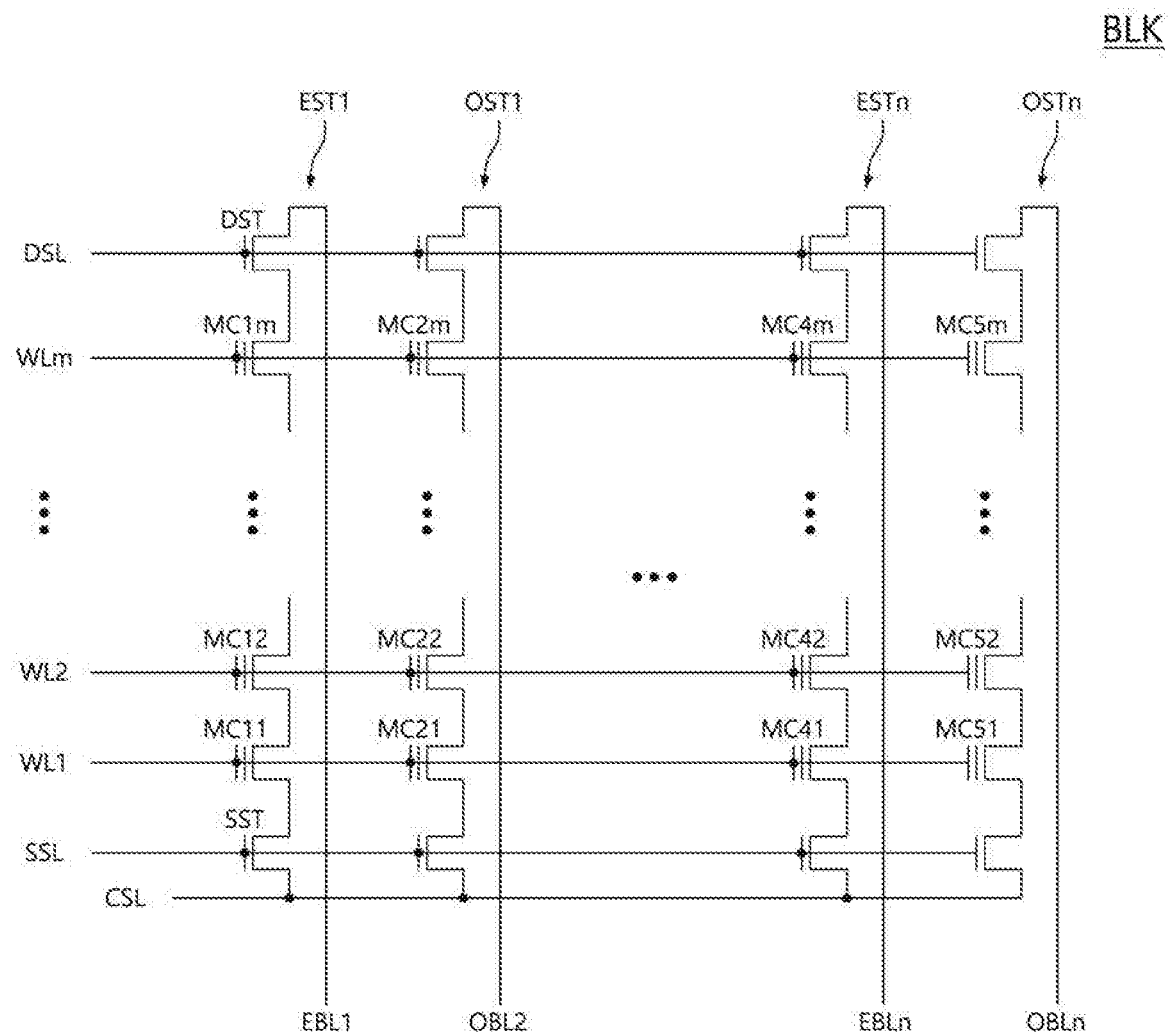
FIG. 3 is a circuit diagram illustrating a memory block of a nonvolatile memory device in accordance with an embodiment of the present invention.

FIG. 3 is a circuit diagram illustrating a memory block BLK of a nonvolatile memory device in accordance with an embodiment of the present invention.

The memory block BLK may include even cell strings EST1 to ESTn which are respectively coupled to first to n^th even bit lines EBL1 to EBLn. Also, the memory block BLK may include odd cell strings OST1 to OSTn which are respectively coupled to first to n^th odd bit lines OBL1 to OBLn. The even cell strings EST1 to ESTn and the odd cell strings OST1 to OSTn have the same circuit configuration, thus, the first even cell string EST1 will be described below as an example.

The first even cell string EST1 may include a plurality of memory cells MC11 to MC1$m$ and select transistors DST and SST, which are coupled between the first even bit line EBL1 and a common source line CSL. In detail, the first even cell string EST1 may include a drain select transistor DST which is coupled to a drain select line DSL, the memory cells MC11 to MC1$m$ which are respectively coupled to word lines WL1 to WLm, and a source select transistor SST which is coupled to a source select line SSL.

Among the memory cells coupled to the even cell strings EST1 to ESTn, memory cells which share one word line may configure one half page HPG, for example, the first half page HPG1 of FIG. 2. Among the memory cells coupled to the odd cell strings OST1 to OSTn, memory cells which share one word line may configure one half page HPG for example, the second half page HPG2 of FIG. 2.

Figure 4:
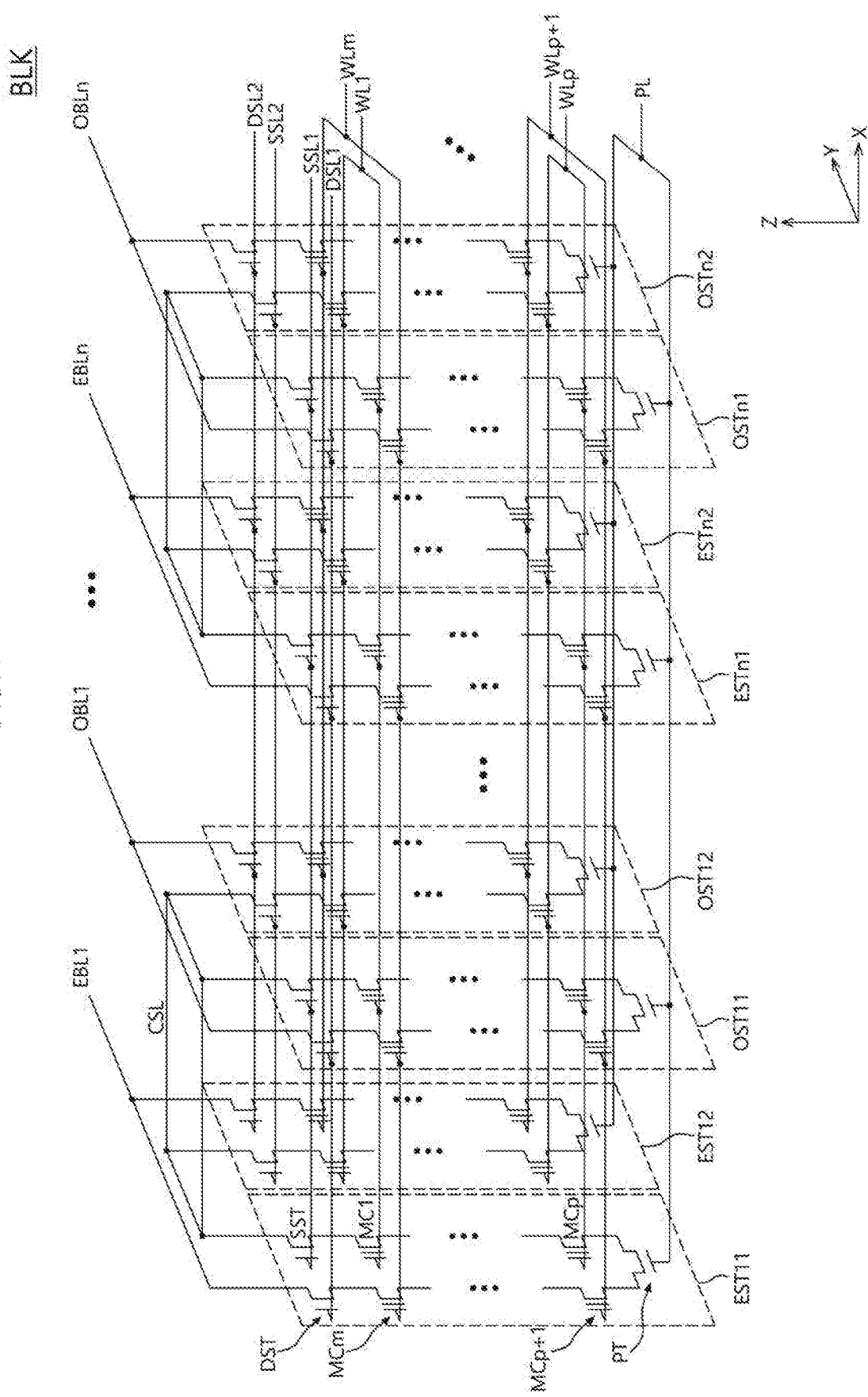
FIG. 4 is a circuit diagram illustrating a memory block of a nonvolatile memory device in accordance with an embodiment of the present invention.

FIG. 4 is a circuit diagram illustrating a memory block BLK of a nonvolatile memory device in accordance with an embodiment of the present invention.

The memory block BLK may include even cell strings EST11 to ESTn2 which are coupled to even bit lines EBL1 to EBLn. Also, the memory block BLK may include odd cell strings OST11 to OSTn2 which are coupled to odd bit lines OBL1 to OBLn. While the memory block BLK in which two cell strings are arranged per bit line is illustrated, it is to be noted that one or more cell strings may be arranged in a column direction (Y direction). The even cell strings EST11 to ESTn2 and the odd cell strings OST11 to OSTn2 have the same circuit configuration, therefore, the first even cell string EST11 will be described below as an example.

The first even cell string EST11 may include a plurality of memory cells MC1 to MCm and select transistors DST, PT and SST which are coupled between the first even bit line EBL1 and a common source line CSL. In detail, the first even cell string EST11 may include a drain select transistor DST which is coupled to a drain select line DSL1, the memory cells MCm to MCp+1 which are respectively coupled to word lines WLm to WLp+1, a pipe transistor PT which is coupled to a pipeline PL, the memory cells MCp to MC1 which are respectively coupled to word lines WLp to WL1, and a source select transistor SST which is coupled to a source select line SSL1.

The drain select transistor DST and the memory cells MCm to MCp+1 may be stacked in a direction (Z direction) perpendicular to a bottom substrate (not shown) in which the memory block BLK is formed. The source select transistor SST and the memory cells MC1 to MCp may be stacked in the direction (Z direction) perpendicular to the bottom substrate in which the memory block BLK is formed. The first even cell string EST11 may be formed into a U-shaped three-dimensional (3D) structure.

Among the memory cells coupled to the even cell strings EST11 to ESTn1 in a row direction (X direction), memory cells which share one word line may configure one half page HPG (for example, the first half page HPG1 of FIG. 2). Among the memory cells coupled to the odd cell strings OST11 to OSTn1 in the row direction (X direction), memory cells which share one word line may configure one half page HPG, for example, the second half page HPG2 of FIG. 2.

Figure 5:
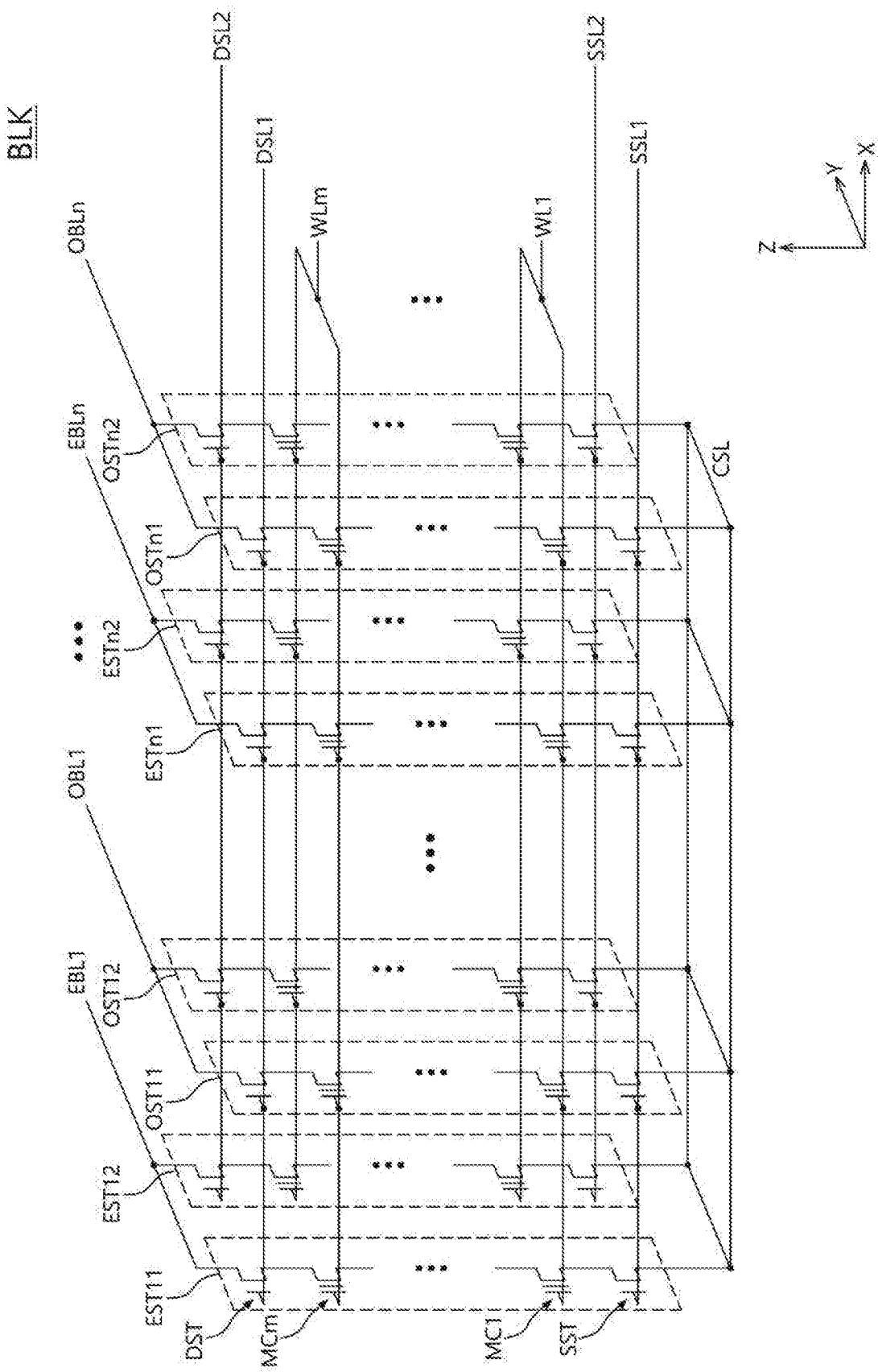
FIG. 5 is a circuit diagram illustrating a memory block of a nonvolatile memory device in accordance with an embodiment of the present invention.

FIG. 5 is a circuit diagram illustrating a memory block BLK of a nonvolatile memory device in accordance with an embodiment of the present invention.

The memory block BLK may include even cell strings EST11 to ESTn2 which are coupled to even bit lines EBL1 to EBLn. Also, the memory block BLK may include odd cell strings OST11 to OSTn2 which are coupled to odd bit lines OBL1 to OBLn. While the memory block BLK in which two cell strings are arranged per bit line is illustrated, it is to be noted that one or more cell strings may be arranged in a column direction (Y direction). The even cell strings EST11 to ESTn2 and the odd cell strings OST11 to OSTn2 have the same circuit configuration, therefore, the first even cell string EST11 will be described below as an example.

The first even cell string EST11 may include a plurality of memory cells MC1 to MCm and select transistors DST and SST which are coupled between the first even bit line EBL1 and a common source line CSL. In detail, the first even cell string EST11 may include a drain select transistor DST which is coupled to a drain select line DSL1, the memory cells MCm to MC1 which are respectively coupled to word lines WLm to WL1, and a source select transistor SST which is coupled to a source select line SSL1.

The drain select transistor DST, the memory cells MCm to MC1 and the source select transistor SST may be stacked in a direction (Z direction) perpendicular to a bottom substrate (not shown) in which the memory block BLK is formed. The first even cell string EST11 may be formed into an I-shaped 3D structure.

Among the memory cells coupled to the even cell strings EST11 to ESTn1 in a row direction (X direction), memory cells which share one word line may configure one half page HPG, for example, the first half page HPG1 shown in FIG. 2. Among the memory cells coupled to the odd cell strings OST11 to OSTn1 in the row direction (X direction), memory cells which share one word line may configure one half page HPG, for example, the second half page HPG2 shown in FIG. 2.

Figure 6:
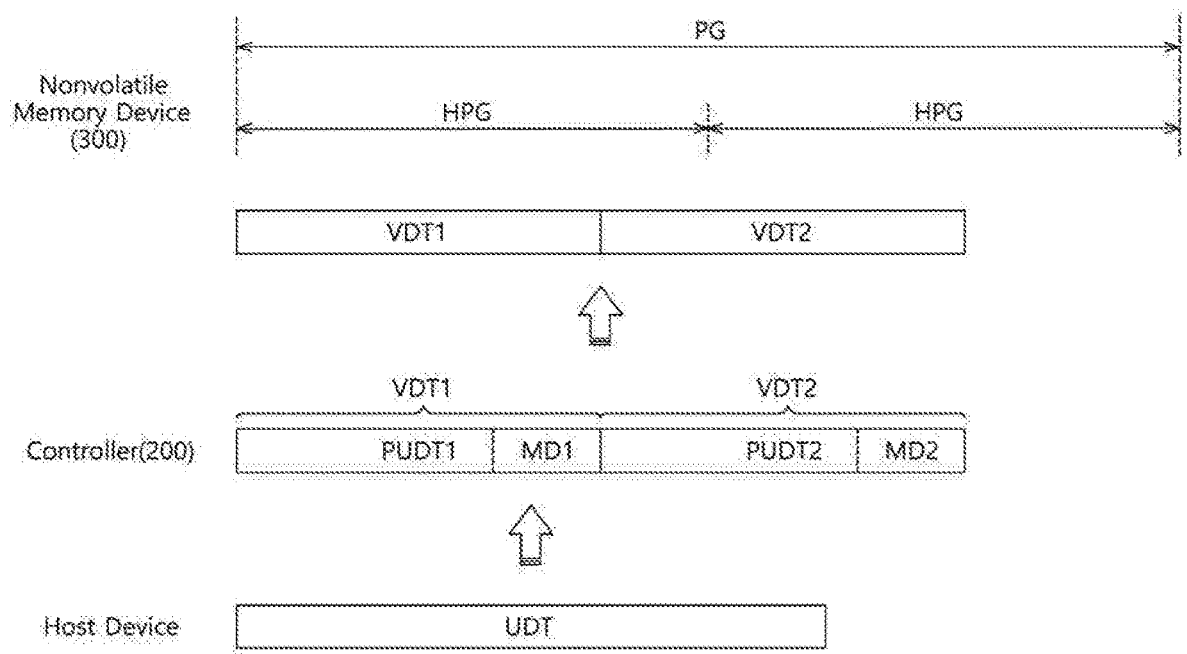
FIG. 6 is a diagram describing valid data and a storage process of valid data in accordance with an embodiment of the present invention.
Figure 7:
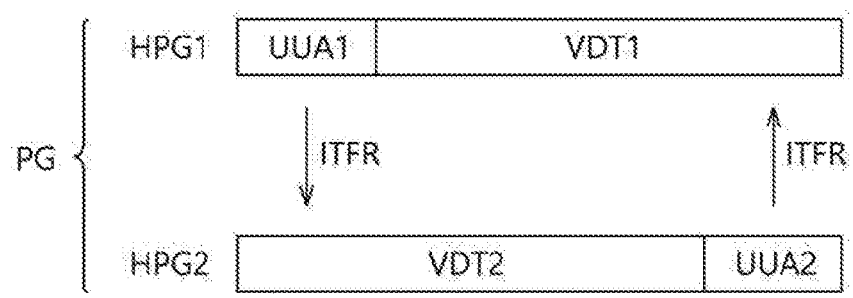
FIG. 7 is a diagram describing data reliability when an unused area occurs due to a small size of valid data.

FIG. 6 is a diagram describing valid data and a storage process of valid data in accordance with an embodiment of the present invention. FIG. 7 is a diagram describing data reliability when an unused area occurs due to a small size of valid data.

Referring to FIG. 6, user data UDT may be transmitted from the host device to be used in the data storage device (100 of FIG. 1). The user data UDT may have a data size smaller than the size of one page PG. That is, the user data UDT may have a data size to be partially stored in one page PG.

The controller (200 of FIG. 1) may process the user data UDT in data management. For example, the controller 200 may divide the user data UDT into partial user data PUDT1 and PUDT2 by a data processing unit of the ECC block (250 of FIG. 2). The controller 200 may add metadata MD1 and MD2 for example, an error correction code, for managing the partial user data PUDT1 and PUDT2, to the partial user data PUDT1 and PUDT2, and generate valid data VDT1 and VDT2. For example, the controller 200 may add first metadata MD1 to first partial user data PUDT1 to generate first valid data VDT1. In the same manner, the controller 200 may add second metadata MD2 to second partial user data PUDT2 to generate second valid data VDT2.

The controller 200 may store the first valid data VDT1 and the second valid data VDT2 in the nonvolatile memory device (300 of FIG. 1). Because the first valid data VDT1 and the second valid data VDT2 are generated based on the user data UDT which have the data size smaller than the size of one page PG as described above, the entirety of the first valid data VDT1 and the second valid data VDT2 may have a data size smaller than the size of one page PG. Moreover, each of the first valid data VDT1 and the second valid data VDT2 may have a data size smaller than the size of one half page HPG.

Referring to FIG. 7, when the size of each of the first valid data VDT1 and the second valid data VDT2 is smaller than the size of one half page HPG, unused areas UUA1 and UUA2, that is, memory cells in each of which data is not stored, may result. If first and second half pages HPG1 and HPG2 are arranged alternately according to cell strings as described above with reference to FIGS. 3 to 5, the unused areas UUA1 and UUA2 may exert adverse influences such as interferences ITFR on the memory cells of used areas in which the first valid data VDT1 and the second valid data VDT2 are stored.

Therefore, the controller 200 may generate dummy data and store the generated dummy data in the unused areas UUA1 and UUA2 of the first and second half pages HPG1 and HPG2 of the nonvolatile memory device 300, so as to fill the memory cells of the unused areas UUA1 and UUA2. Accordingly, data are fully filled in the first and second half pages HPG1 and HPG2.

Figure 8:
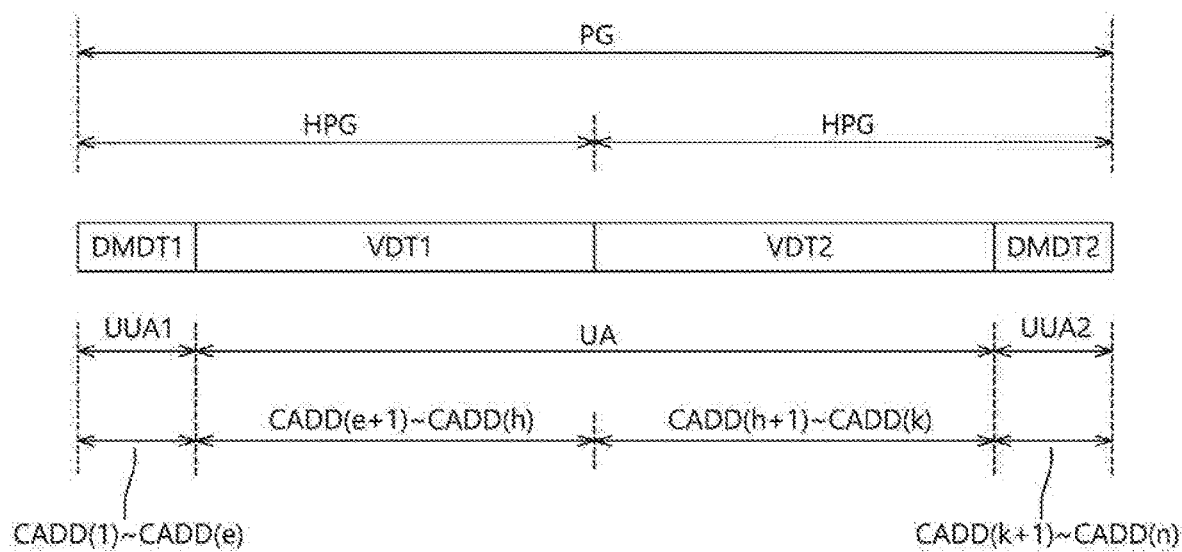
FIG. 8 is a diagram describing a method of storing valid data and dummy data in accordance with an embodiment of the present invention.

FIG. 8 is a diagram describing a method of storing valid data and dummy data in accordance with an embodiment of the present invention.

The controller 200 may provide column addresses CADD to the nonvolatile memory device 300, and the nonvolatile memory device 300 may store dummy data DMDT1 and DMDT2 and the valid data VDT1 and VDT2 according to the column addresses CADD. That is, data may be stored according to the column addresses CADD in one page PG.

As illustrated in FIG. 8, to minimize adverse influences to be exerted on the memory cells of a used area UA by the memory cells of the unused areas UUA1 and UUA2 and allow the valid data VDT1 or VDT2 to be read at one time by the second read unit, that is, the half page HPG, the dummy data DMDT1 and DMDT2 and the valid data VDT1 and VDT2 may be stored on the basis of the second read unit. Namely, the data size of the first dummy data DMDT1 and the first valid data VDT1 may be the same as the size of the half page HPG. Further, the data size of the second dummy data DMDT2 and the second valid data VDT2 may be the same as the size of the half page HPG.

From the viewpoint of the second read unit, the first valid data VDT1 and the second valid data VDT2 may be stored in memory cells respectively within the second read unit, and be stored to be successive to each other. The first dummy data DMDT1 may be stored in the memory cells of the unused area UUA1 within the second read unit in which the corresponding first valid data VDT1 are stored. The second dummy data DMDT2 may be stored in the memory cells of the unused area UUA2 within the second read unit in which the corresponding second valid data VDT2 are stored.

From the viewpoint of the first read unit that is, the page PG, the first dummy data DMDT1, the first valid data VDT1, the second valid data VDT2 and the second dummy data DMDT2 may be stored sequentially in memory cells within the first read unit. That is, the first dummy data DMDT1 may be stored in the memory cells of the first unused area UUA1 which is positioned at one end of the first read unit, and the second dummy data DMDT2 may be stored in the memory cells of the second unused area UUA2 which is positioned at the other end of the first read unit. The first valid data VDT1 and the second valid data VDT2 may be sequentially stored in the memory cells of the used area UA between the first dummy data DMDT1 and the second dummy data DMDT2.

From the viewpoint of column addresses, the first dummy data DMDT1 may be stored in memory cells corresponding to a first column address CADD(1) to an e^th column address CADD(e), the first valid data VDT1 may be stored in memory cells corresponding to an (e+1)^th column address CADD(e+1) to an h^th column address CADD(h), the second valid data VDT2 may be stored in memory cells corresponding to an (h+1)^th column address CADD(h+1) to a k^th column address CADD(k), and the second dummy data DMDT2 may be stored in memory cells corresponding to a (k+1)^th column address CADD(k+1) to an n^th column address CADD(n).

Figure 9:
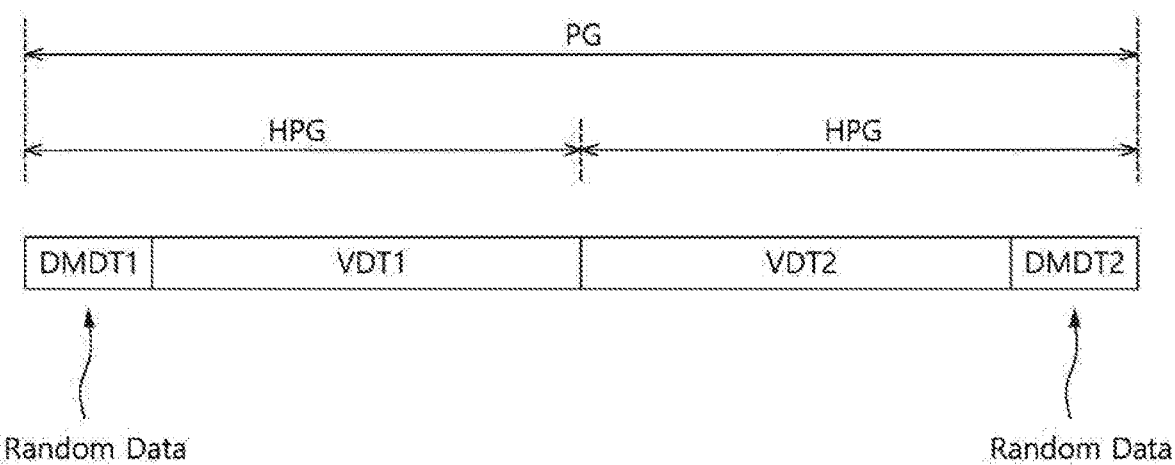
FIGS. 9 to 11 are diagrams describing types of dummy data in accordance with an embodiment of the present invention.
Figure 10:
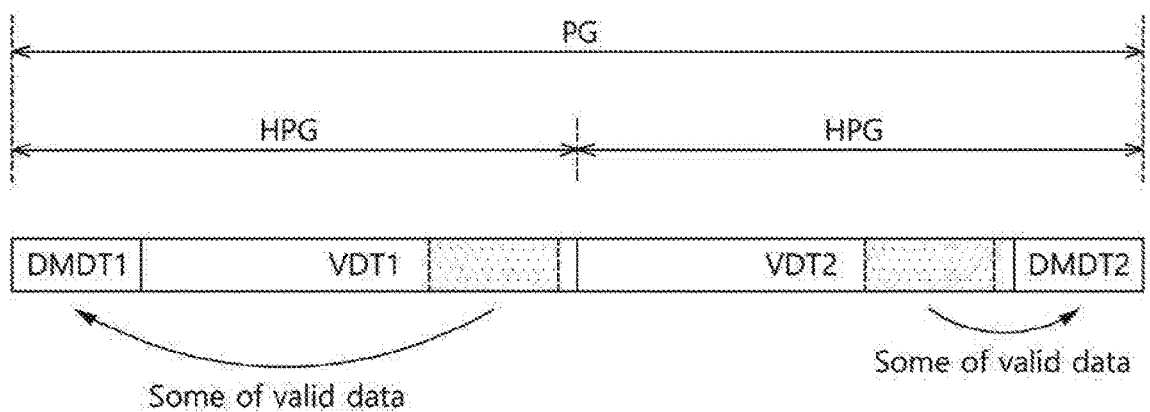
Figure 11:
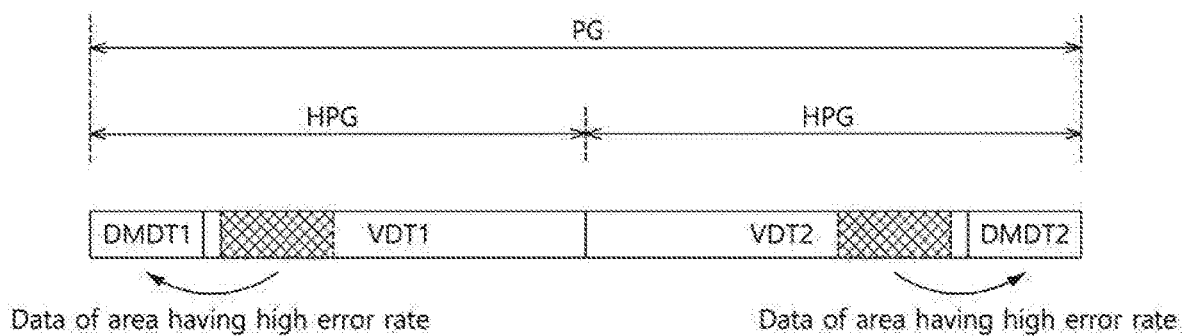

FIGS. 9 to 11 are diagrams describing types of dummy data in accordance with an embodiment of the present invention.

Referring to FIG. 9, dummy data DMDT1 and DMDT2 may include random data which are generated by the controller 200. The dummy data DMDT1 and DMDT2 may include meaningless data which have no relevance to valid data VDT1 and VDT2.

Referring to FIG. 10, dummy data DMDT1 and DMDT2 may include some data of corresponding valid data VDT1 and VDT2. For example, the first dummy data DMDT1 may include some data of the first valid data VDT1, and the second dummy data DMDT2 may include some data of the second valid data VDT2.

Referring to FIG. 11, dummy data DMDT1 and DMDT2 may include data stored in memory cells having a high error occurrence rate, among memory cells in which corresponding valid data VDT1 and VDT2 are stored. For example, the first dummy data DMDT1 may include data stored in memory cells having a high error occurrence rate, among memory cells in which the first valid data VDT1 are stored. The second dummy data DMDT2 may include data stored in memory cells having a high error occurrence rate, among memory cells in which the second valid data VDT2 are stored. Memory cells having a high error occurrence rate may be determined by the ECC block 250 during a run-time. In this case, positions of the memory cells having a high error occurrence rate may be variable. As another example, memory cells having a high error occurrence rate may be determined in the course of manufacture due to a processing or design issue. In this case, positions of the memory cells having a high error occurrence rate may be fixed.

Figure 12:
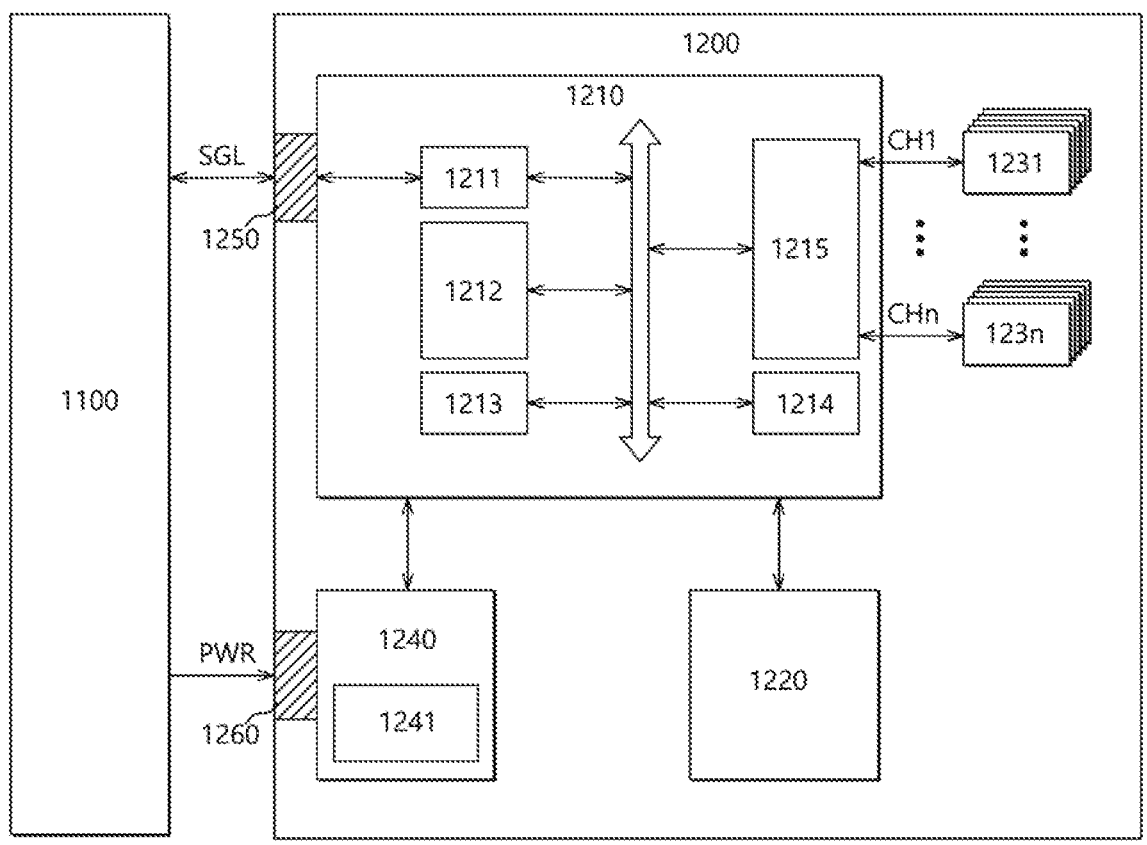
FIG. 12 is a diagram illustrating a data processing system including a solid state drive in accordance with an embodiment of the present invention.

FIG. 12 is a diagram illustrating a data processing system 1000 including a solid state drive (SSD) 1200 in accordance with an embodiment of the present invention.

Referring to FIG. 12, the data processing system 1000 may include a host device 1100 and the SSD 1200.

The SSD 1200 may include a controller 1210, a buffer memory device 1220, nonvolatile memory devices 1231 to 123n, a power supply 1240, a signal connector 1250, and a power connector 1260.

The controller 1210 may control general operations of the SSD 1200. The controller 1210 may include a host interface unit 1211, a control unit 1212, a random access memory 1213, an error correction code (ECC) unit 1214, and a memory interface unit 1215.

The host interface unit 1211 may exchange a signal SGL with the host device 1100 through the signal connector 1250. The signal SGL may include a command, an address, data, and so forth. The host interface unit 1211 may interface the host device 1100 and the SSD 1200 according to the protocol of the host device 1100. For example, the host interface unit 1211 may communicate with the host device 1100 through any one of standard interface protocols such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI express (PCI-E) and universal flash storage (UFS).

The control unit 1212 may analyze and process the signal SGL inputted from the host device 1100. The control unit 1212 may control operations of internal function blocks according to a firmware or a software for driving the SSD 1200. The random access memory 1213 may be used as a working memory for driving such a firmware or software.

The ECC unit 1214 may generate parity data that is, an error correction code of data to be transmitted to the nonvolatile memory devices 1231 to 123n. The generated parity data may be stored together with the data in the nonvolatile memory devices 1231 to 123n. The ECC unit 1214 may detect an error of the data read from the nonvolatile memory devices 1231 to 123n, based on the parity data. If a detected error is within a correctable range, the ECC unit 1214 may correct the detected error.

The memory interface unit 1215 may provide control signals such as commands and addresses to the nonvolatile memory devices 1231 to 123n, according to control of the control unit 1212. Moreover, the memory interface unit 1215 may exchange data with the nonvolatile memory devices 1231 to 123n, according to control of the control unit 1212. For example, the memory interface unit 1215 may provide the data stored in the buffer memory device 1220, to the nonvolatile memory devices 1231 to 123n, or provide the data read from the nonvolatile memory devices 1231 to 123n, to the buffer memory device 1220.

The buffer memory device 1220 may temporarily store data to be stored in the nonvolatile memory devices 1231 to 123n. Further, the buffer memory device 1220 may temporarily store the data read from the nonvolatile memory devices 1231 to 123n. The data temporarily stored in the buffer memory device 1220 may be transmitted to the host device 1100 or the nonvolatile memory devices 1231 to 123n according to control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 13:
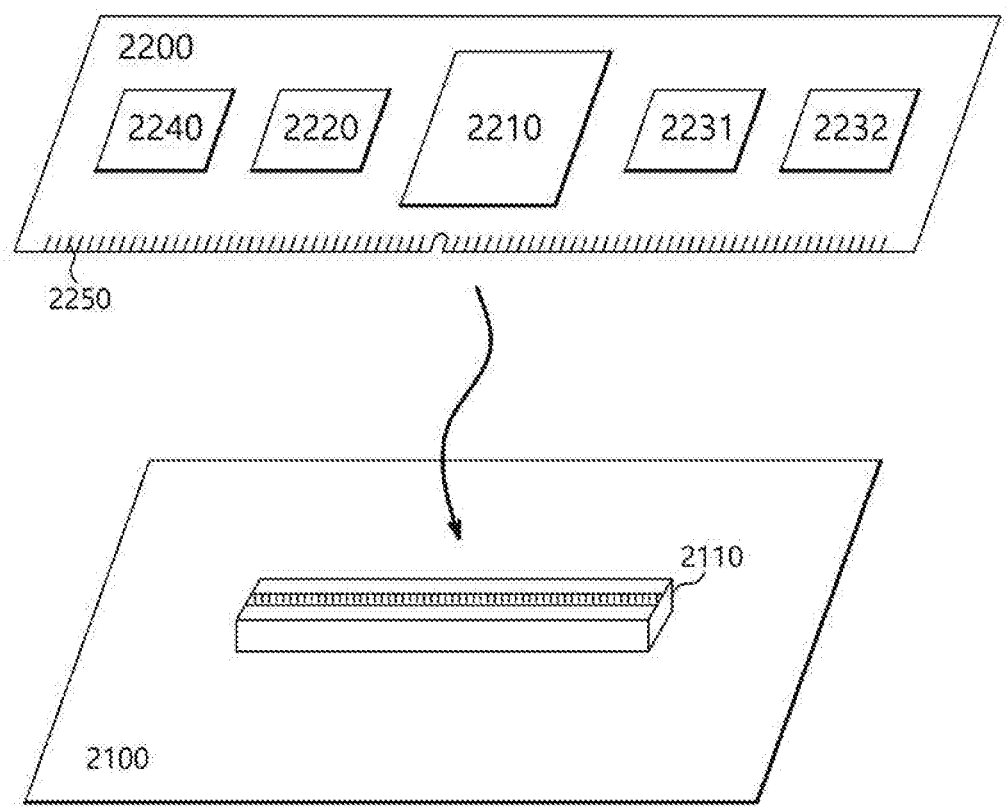
FIG. 13 is a diagram illustrating a data processing system including a data storage device in accordance with an embodiment of the present invention.

FIG. 13 is a diagram illustrating a data processing system 2000 including a data storage device 2200 in accordance with an embodiment of the present invention.

Referring to FIG. 13, the data processing system 2000 may include a host device 2100 and the data storage device 2200.

The host device 2100 may be configured in the form of a board such as a printed circuit board (PCB). Although not shown, the host device 2100 may include internal function blocks for performing the function of a host device.

The host device 2100 may include a connection terminal 2110 such as a socket, a slot or a connector. The data storage device 2200 may be mounted to the connection terminal 2110.

The data storage device 2200 may be configured in the form of a board such as a printed circuit board. The data storage device 2200 may be referred to as a memory module or a memory card. The data storage device 2200 may include a controller 2210, a buffer memory device 2220, nonvolatile memory devices 2231 and 2232, a power management integrated circuit (PMIC) 2240, and a connection terminal 2250.

The controller 2210 may control general operations of the data storage device 2200. The controller 2210 may be configured in the same manner as the controller 1210 shown in FIG. 12.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the data storage device 2200.

The PMIC 2240 may provide the power inputted through the connection terminal 2250, to the inside of the data storage device 2200. The PMIC 2240 may manage the power of the data storage device 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the data storage device 2200. The connection terminal 2250 may be configured into various types depending on an interface scheme between the host device 2100 and the data storage device 2200. The connection terminal 2250 may be disposed on any one side of the data storage device 2200.

Figure 14:
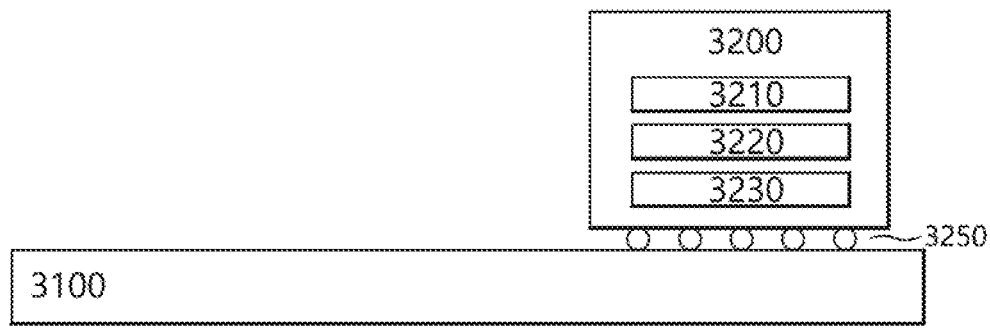
FIG. 14 is a diagram illustrating a data processing system including a data storage device in accordance with an embodiment of the present invention.

FIG. 14 is a diagram illustrating a data processing system 3000 including a data storage device 3200 in accordance with an embodiment of the present invention.

Referring to FIG. 14, the data processing system 3000 may include a host device 3100 and the data storage device 3200.

The host device 3100 may be configured in the form of a board such as a printed circuit board (PCB). Although not shown, the host device 3100 may include internal function blocks for performing the function of a host device.

The data storage device 3200 may be configured in the form of a surface-mounting type package. The data storage device 3200 may be mounted to the host device 3100 through solder balls 3250. The data storage device 3200 may include a controller 3210, a buffer memory device 3220, and a nonvolatile memory device 3230.

The controller 3210 may control general operations of the data storage device 3200. The controller 3210 may be configured in the same manner as the controller 1210 shown in FIG. 12.

The buffer memory device 3220 may temporarily store data to be stored in the nonvolatile memory device 3230. Further, the buffer memory device 3220 may temporarily store the data read from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the data storage device 3200.

Figure 15:
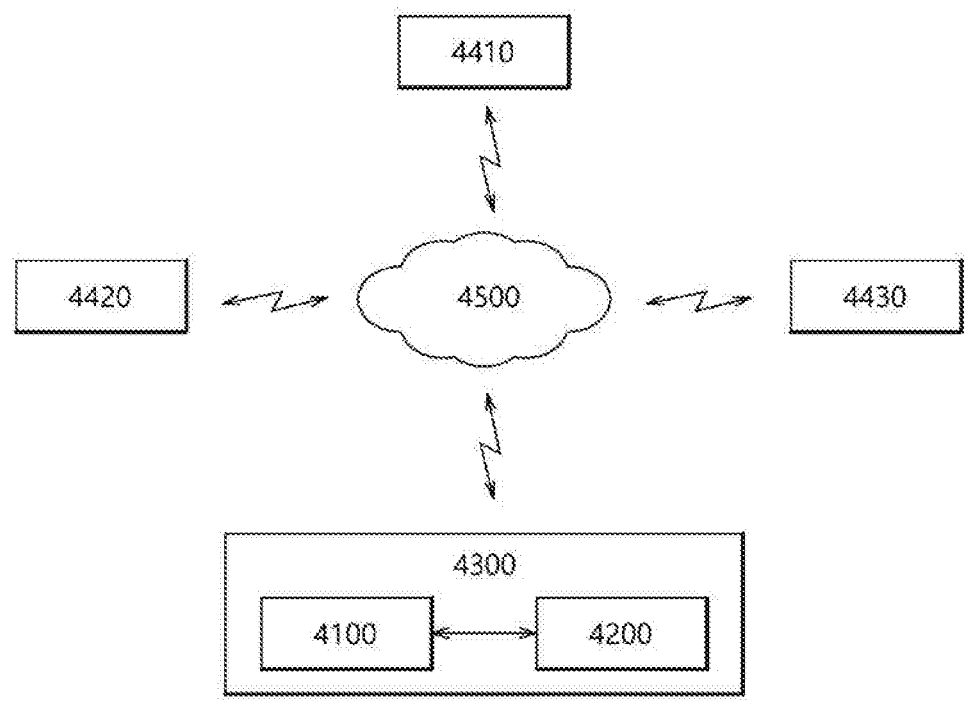
FIG. 15 is a diagram illustrating a network system including a data storage device in accordance with an embodiment of the present invention.

FIG. 15 is a diagram illustrating a network system 4000 including a data storage device 4200 in accordance with an embodiment of the present invention.

Referring to FIG. 15, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the data storage device 4200. The data storage device 4200 may be configured by the data storage device 100 shown in FIG. 1, the data storage device 1200 shown in FIG. 12, the data storage device 2200 shown in FIG. 13 or the data storage device 3200 shown in FIG. 14.

Figure 16:
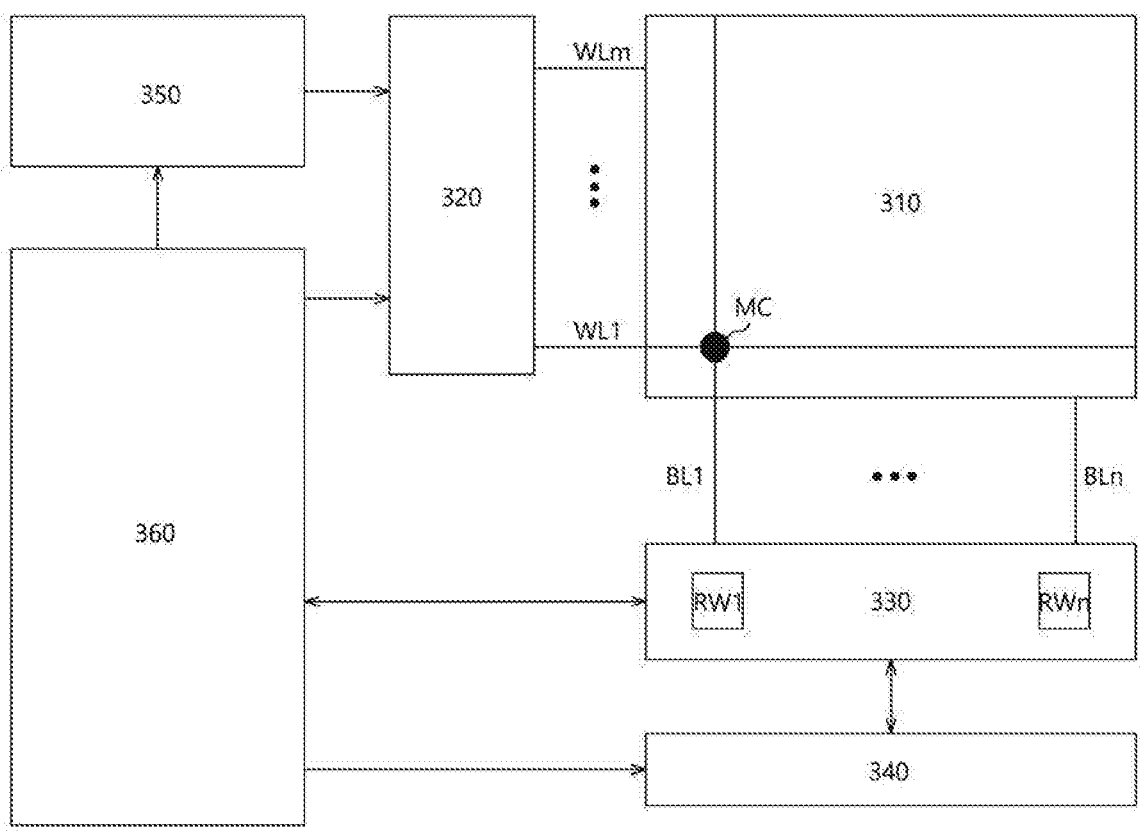
FIG. 16 is a block diagram illustrating a nonvolatile memory device included in a data storage device in accordance with an embodiment of the present invention.

FIG. 16 is a block diagram illustrating a nonvolatile memory device included in a data storage device in accordance with an embodiment of the present invention. The nonvolatile memory device 300 of FIG. 1 is described as an example.

Referring to FIG. 16, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the selected one from the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells on which the program operation is to be performed. For another example, an erase voltage generated in an erase operation may be applied to a well area of memory cells on which the erase operation is to be performed. For still another example, a read voltage generated in a read operation may be applied to a word line of memory cells on which the read operation is to be performed.

The control logic 360 may control general operations of the nonvolatile memory device 300, based on control signals provided from the external device. For example, the control logic 360 may control operations of the nonvolatile memory device 300 such as read, write and erase operations of the nonvolatile memory device 300.

While various embodiments have been described above, it will be understood to those skilled in the art that the embodiments described are examples only. Accordingly, the data storage device and the operating method thereof described herein should not be limited based on the described embodiments.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A method for operating a data storage device, comprising:
    providing a nonvolatile memory device including a page divided into a first half page and a second half page;
    dividing, when receiving user data smaller than a size of one page from a host device, the user data into first partial data and second partial data;
    generating first valid data and second valid data by adding an error correction code to the first partial data and the second partial data, respectively;
    generating first dummy data to be stored in the first half page together with the first valid data and second dummy data to be stored in the second half page together with the second valid data;
    storing the first valid data in the first half page and the second valid data in the second half page such that the first valid data and the second valid data are sequentially stored in memory cells; and
    storing the first dummy data in a first unused area of the first half page and the second dummy data in a second unused area of the second half page,
    wherein the first unused area and the second unused area are memory cells in which data is not stored,
    wherein the first dummy data includes at least one of a portion of the first valid data, data which is meaningless to the first valid data, and data stored in memory cells having a high error occurrence rate among memory cells in which the first valid data are stored,
    wherein the second dummy data includes at least one of a portion of the second valid data, data which is meaningless to the second valid data, and data stored in memory cells having a high error occurrence rate among memory cells in which the second valid data are stored, and
    wherein the first dummy data is stored in the memory cells of the first unused area which is positioned at one end of the first half page, and the second dummy data is stored in the memory cells of the second unused area which is positioned at the other end of the second half page.

2. A data storage device comprising:
    a nonvolatile memory device including a page which is configured by memory cells corresponding to a first column address to an n^th column address, wherein the page is divided into a first half page which is configured by first memory cells corresponding to the first column address to an h^th column address, and a second half page which is configured by second memory cells corresponding to an (h+1)^th column address to the n^th column address; and
    a controller suitable for dividing, when receiving user data smaller than a size of one page, the user data into first partial data and second partial data, generating first valid data and second valid data by adding an error correction code to the first partial data and the second partial data, respectively, generating first dummy data to be stored in a first unused area of the first half page together with the first valid data and second dummy data to be stored in a second unused area of the second half page together with the second valid data, and controlling the nonvolatile memory device such that the first dummy data and the first valid data are stored sequentially in the first memory cells, and the second valid data and the second dummy data are stored sequentially in the second memory cells,
    wherein the first unused area and the second unused area are memory cells in which data is not stored,
    wherein the first dummy data includes at least one of a portion of the first valid data, data which is meaningless to the first valid data, and data stored in memory cells having a high error occurrence rate among memory cells in which the first valid data are stored,
    wherein the second dummy data includes at least one of a portion of the second valid data, data which is meaningless to the second valid data, and data stored in memory cells having a high error occurrence rate among memory cells in which the second valid data are stored, and
    wherein the first dummy data is stored in the memory cells of the first unused area which is positioned at one end of the first half page, and the second dummy data is stored in the memory cells of the second unused area which is positioned at the other end of the second half page.

3. The data storage device according to claim 2, wherein the controller controls the nonvolatile memory device by providing the first column address to an e^th column address for storing the first dummy data, and an (e+1)^th column address to the h^th column address for storing the first valid data, to the nonvolatile memory device.

4. The data storage device according to claim 2, wherein the controller controls the nonvolatile memory device by providing the (h+1)^th column address to a k^th column address for storing the second valid data, and a (k+1)^th column address to the n^th column address for storing the second dummy data, to the nonvolatile memory device.

* * * * *